United States Patent
Curtis et al.

(12) 
(10) Patent No.: US 6,191,875 B1
(45) Date of Patent: Feb. 20, 2001

(54) PROCESS FOR HOLOGRAPHY USING REFERENCE BEAM HAVING CORRELATED PHASE CONTENT

(75) Inventors: Kevin Richard Curtis, New Providence, NJ (US); Peter B. Littlewood, Cambridge (GB); Partha Pratim Mitra, Summit; William Larry Wilson, Somerville, both of NJ (US)

(73) Assignee: Lucent Technologies Inc., Murray Hill, NJ (US)

( * ) Notice: Under 35 U.S.C. 154(b), the term of this patent shall be extended for 0 days.

(21) Appl. No.: 09/363,336

(22) Filed: Jul. 29, 1999

(51) Int. Cl.[7] .................................................. G03H 1/12
(52) U.S. Cl. .................. 359/11; 359/10; 359/24; 359/1
(58) Field of Search .................. 359/10, 11, 1, 359/24, 29

(56) References Cited

U.S. PATENT DOCUMENTS 5,703,705 * 12/1997 Curtis ...................................... 359/22
5,719,691 * 2/1998 Curtis ...................................... 359/11
5,892,601 4/1999 Curtis et al. .
5,940,514 * 8/1999 Heanue .................................. 359/11

* cited by examiner

*Primary Examiner*—Cassandra Spyrou
*Assistant Examiner*—Leo Boutsikaris
(74) *Attorney, Agent, or Firm*—Scott J. Rittman

(57) ABSTRACT

An improved process for holography is provided, in which the reference beam used for storage and readout has a correlated phase content. In particular, it was found that reference beams having random phase content limited the attainable storage density and the accuracy of readout of stored holograms due to uncontrolled fluctuations in the correlation selectivity. By contrast, a reference beam having correlated phase content provides accurate shift selectivity, the ability to tailor the reference beam spectrum to minimize crosstalk between neighboring holograms, and mitigation of limitations inherent in the holographic system or holographic medium. Improved storage density and readout accuracy are thereby attained.

9 Claims, 5 Drawing Sheets

HISTOGRAM OF $|g(x,y, \varepsilon x=0, \varepsilon y=0)|$

HISTOGRAM OF $|g(x=y=0, \varepsilon x, \varepsilon y)|$

HISTOGRAM OF $|g(\varepsilon x=0, x=400, y, \varepsilon y)|$

HISTOGRAM OF $|g(\varepsilon x=0, x=0.2, \varepsilon y, y)|$

PROCESS FOR HOLOGRAPHY USING REFERENCE BEAM HAVING CORRELATED PHASE CONTENT

BACKGROUND OF THE INVENTION

1. Field of the Invention

The invention relates to holographic storage, in particular holographic storage processes such as phase correlation multiplexing.

2. Discussion of the Related Art

Holographic memory systems involve the three-dimensional storage of holographic representations (i.e., holograms) of data elements as a pattern of varying refractive index and/or absorption imprinted into the volume of a storage medium. Holographic memory systems are characterized by their high density storage potential and the potential speed with which the stored data is randomly accessed and transferred.

In general, holographic storage memory systems operate by combining a data-encoded object beam with a reference beam to create an interference pattern in a photosensitive storage medium. (See, e.g., D. Psaltis et al., "Holographic Memories," *Scientific American,* November 1995, the disclosure of which is hereby incorporated by reference.) The interference pattern induces material alterations in the medium that create a hologram. The formation of the hologram in the storage medium is a function of the relative amplitudes and polarization states of, and phase differences between, the object beam and the reference beam. It is also highly dependent on the incident beams' wavelengths and the angles at which the object beam and the reference beam are projected into the storage medium.

Holographically stored data is reconstructed by projecting into the medium a reference beam at the same angle, wavelength, phase, and position as the reference beam used to produce the hologram. The hologram and the reference beam interact to reconstruct the stored object beam. The reconstructed object beam then is detected, e.g., using a photodetector array, and the recovered data is post-processed for delivery to output devices.

Typically, the dynamic range of the holographic storage medium is larger than what is needed to store a single hologram with an acceptable signal-to-noise ratio. Therefore, it is often desirable to multiplex a number of holograms at one location to attain greater storage density. One technique for multiplexing is phase correlation multiplexing, as discussed in co-assigned U.S. Pat. No. 5,719,691, the disclosure of which is hereby incorporated by reference. In phase correlation multiplexing, correlation sensitivity and Bragg selectivity are used to differentiate overlapping holograms within a medium. Correlation selectivity relies on the differences in amplitude, phase, and angle content of the reference beam generated by the relative shift of the storage medium with respect to the reference beam. See also co-assigned U.S. Pat. No. 5,703,705, relating to tilt multiplex holography.

While holographic processes such as phase correlation multiplexing provides useful results, variations and improvements in such processes are actively being sought to provide increased storage density and more accurate readout of stored holograms.

SUMMARY OF THE INVENTION

The invention provides an improved process for holography, in which the reference beam used for storage and readout has a correlated phase content, as specifically defined below. In particular, it was found that reference beams having random phase content limited the attainable storage density and the accuracy of readout of stored holograms due to uncontrolled fluctuations in the correlation selectivity. By contrast, a reference beam having correlated phase content provides accurate shift selectivity, the ability to tailor the reference beam spectrum to minimize crosstalk between neighboring holograms, and mitigation of limitations inherent in the holographic system or holographic medium. Improved storage density and readout accuracy are thereby attained.

In one embodiment, the reference beam having correlated phase content is provided by directing a plane wave, coherent beam of light through particular optics, e.g., a phase mask having an linearly-varying distribution of pixels (referred to as a chirped mask). Such masks provide correlation by introducing complex phase content onto the wavefront of an optical beam by generating spatially dependent optical delay and amplitude modification. It is also possible to provide a reference beam having correlated phase content by other techniques, e.g., using an array of point sources such as a laser array, optionally coupled with an optical device such as a lenslet array.

DETAILED DESCRIPTION OF THE INVENTION

Figure 8:
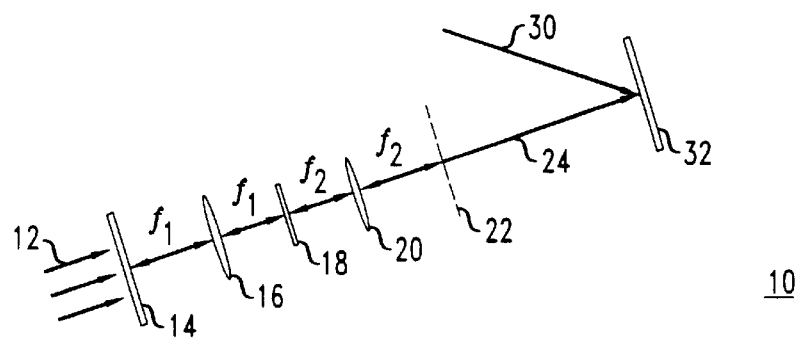
FIG. 8 is a schematic diagram of a holographic process according to one embodiment of the invention.

According to the invention, holography is performed using a reference beam having correlated phase content. A beam contains correlated phase content if the beam exhibits a statistically significant difference from an exponential intensity distribution generated from passing a beam through a random phase mask, as measured by a Chi Squared test at a significance level of 95%. In particular, a determination whether a reference beam has correlated phase content is made as follows. An image of a single pixel is stored in a hologram using a conventional apparatus such as illustrated in FIG. 8. The stored hologram is read as an image with the same reference beam at a relative shift of the media with respect to the beams, $\epsilon$. The image obtained has an amplitude $g(x, y, \epsilon_x, \epsilon_y)$, where (x,y) are the coordinates of the image obtained at the corresponding shifts ($\epsilon_x$, $\epsilon_y$). The function g is referred to as the transfer function.

Figure 1A:
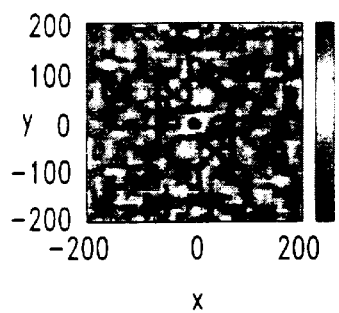
FIGS. 1A–1C illustrate intensity of the transfer function, g, for a beam directed through a random phase mask.
Figure 1B:
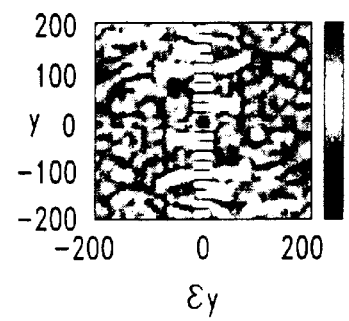
Figure 1C:
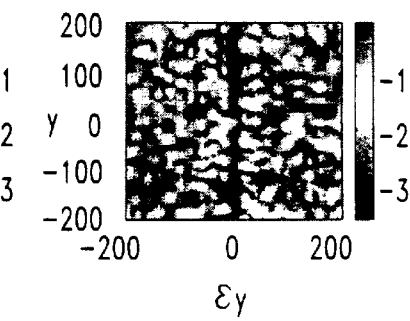
Figure 2A:
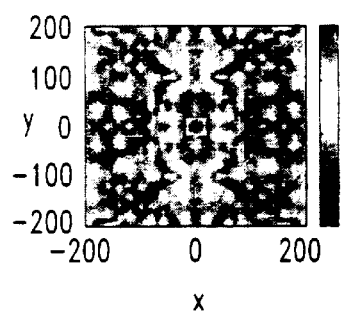
FIGS. 2A–2C illustrate a characteristic of correlated reference beams according to the invention.
Figure 2B:
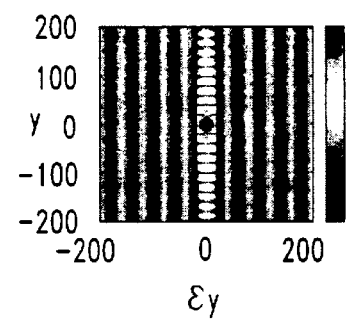
Figure 2C:
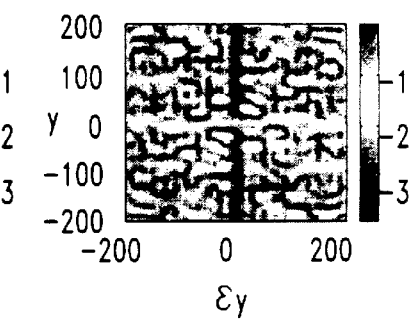

Aside from the required peak at the origin of all the coordinates, which is necessary for reconstruction of a desired image, the transfer function has spectral intensity content for all shifts and positions. The three plots of FIGS. 1A–1C show the spectral intensity of the transfer function calculated for a random mask. (The mask used for the calculations was a 100×100 pixelated random phase mask having 20 μm square pixels. The intensity scales in FIGS. 1A through 3C are logarithmic, base 10, and the dimensions are in microns) FIG. 1A shows a plot at x=y=0 with varied $\epsilon_x$ and $\epsilon_y$. FIG. 1B shows a plot at x=$\epsilon_x$=0 with varied y and $\epsilon_y$. FIG. 1C shows a plot at x=400, $\epsilon_x$=0, with varied y and $\epsilon_y$. The random character is evident, and is quantified by plotting a histogram of the amplitudes of g(x,y) at x=y=$\epsilon_x$=$\epsilon_y$=0, shown in FIG. 4 for several values of N (defined below). For a random pixelated mask, the histogram of spectral intensities, which would be exponential for such a mask, is denoted by:

$$P(I) \exp(-5N^2 I/2), \tag{1}$$

where N is the number pixels in the mask; and I is the intensity—which is equal to $|g^2|$.

Figure 3A:
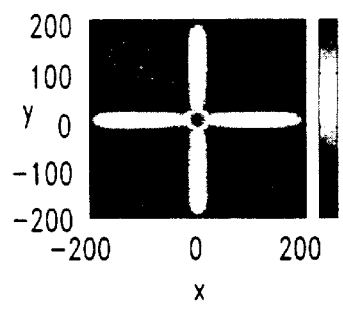
FIGS. 3A–3C illustrate a characteristic of correlated reference beams according to the invention.
Figure 3B:
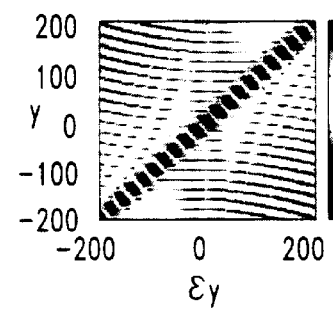
Figure 3C:
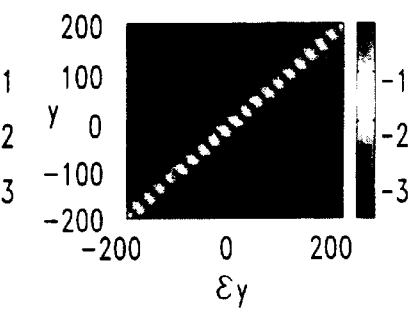

FIGS. 2A–2C and 3A–3C show the transfer function, at the same particular shifts and/or coordinates as in FIGS. 1A–1C, respectively, for masks that provide a correlated phase content. (FIGS. 2A–2C reflect a phase pattern of the form $\phi(m,n)$ $n^2$randperm(m), where m,n are the integer coordinates of square pixels on the reference mask in the (x,y) directions, and randperm(m) is a randomly chosen permutation of the index m. FIGS. 3A–3C reflect a phase pattern of the form $\phi(m,n)$ $m^2+n^2$, with m and n having the same meaning.) The sections of the transfer function shown for these two phase contents clearly show order that suggests correlated phase content. However, as stated above, affirmation of correlated phase content requires determining if the reference beam exhibits a statistically significant difference from an exponential intensity distribution generated from passing a beam through a random phase mask.

Figure 4:
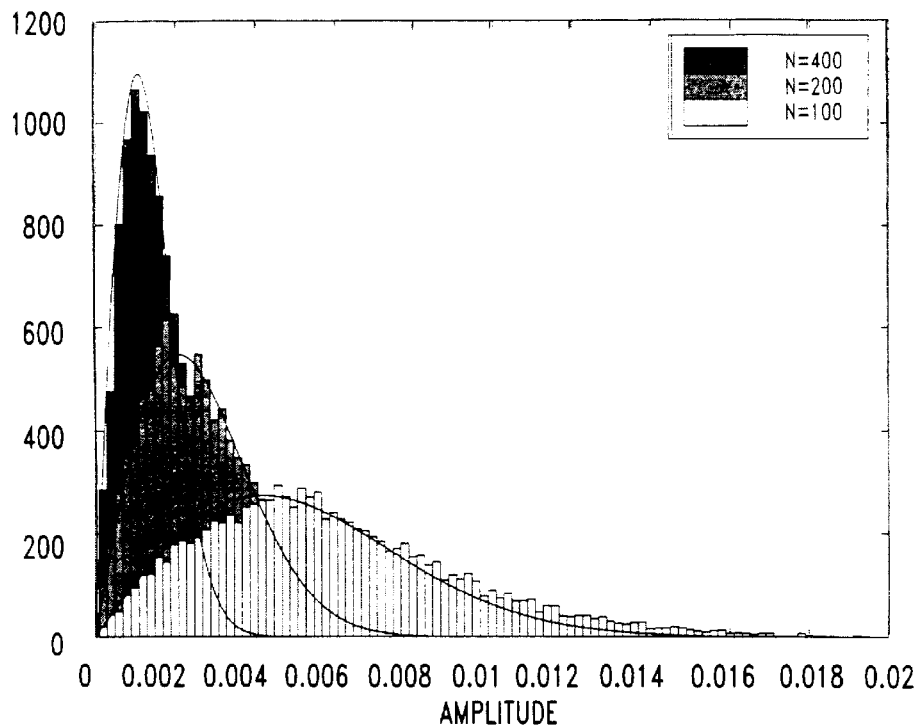
FIG. 4 illustrates three histograms of intensities for beams directed through three random phase masks.

For example, the histogram generated from Equation 1 for the random mask is shown in FIG. 4, for three different mask sizes—100, 200, and 400 microns, and reflects that the exponential form is easily fit to the data. Comparison to this form determines whether the reference beam in question contains correlated phase content.

Figure 5:
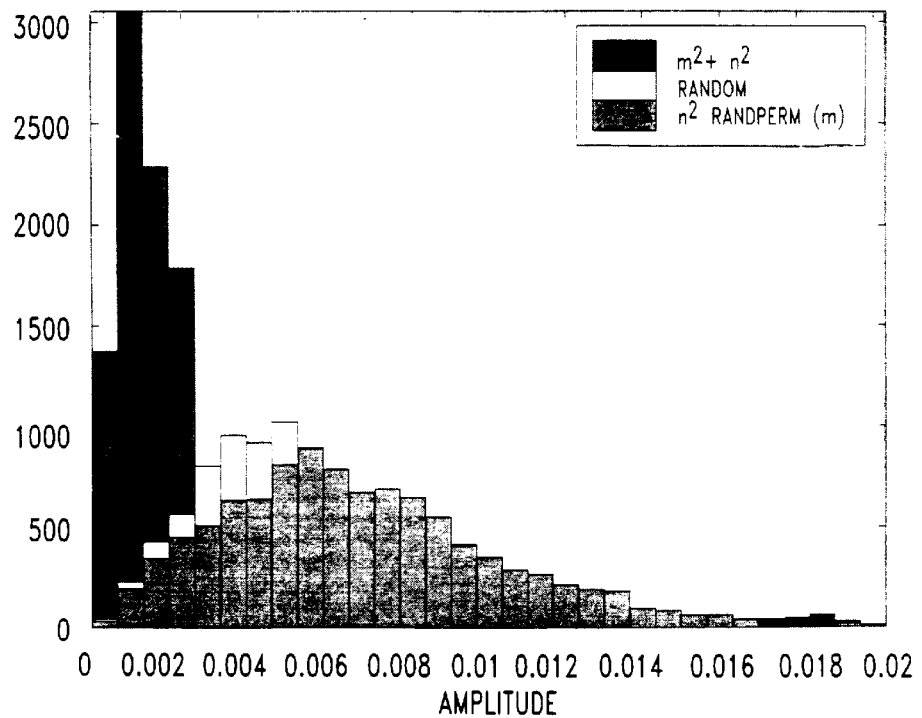
FIG. 5 illustrates a comparison of the intensity histogram of the readout of a plane wave hologram for a random beam, with intensity histograms for two correlated beams.
Figure 6:
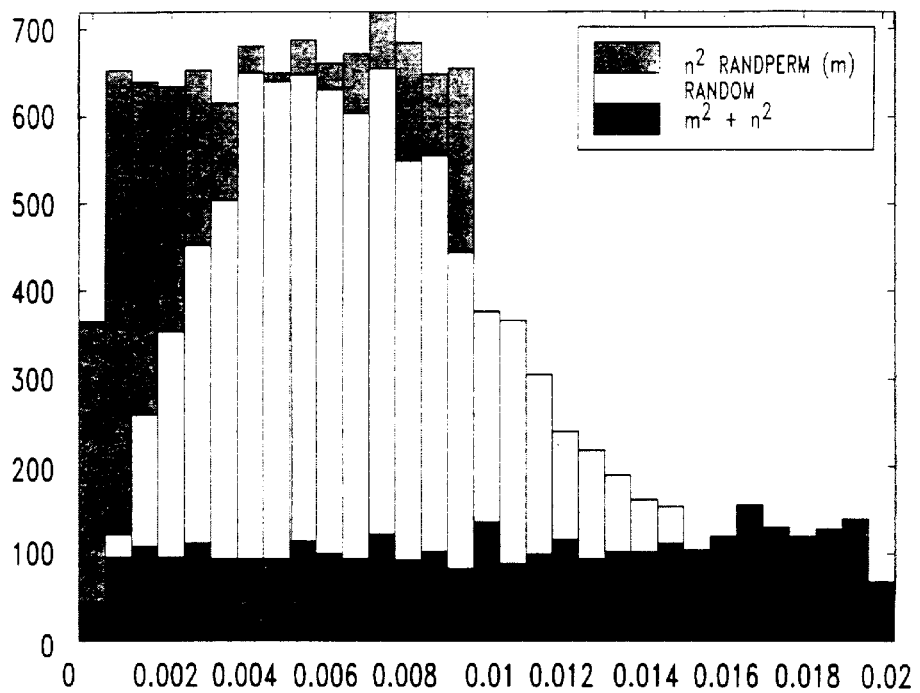
FIG. 6 illustrates a comparison of the intensity histogram of the readout of a plane wave hologram for a random beam, with intensity histograms of two correlated beams.
Figure 7:
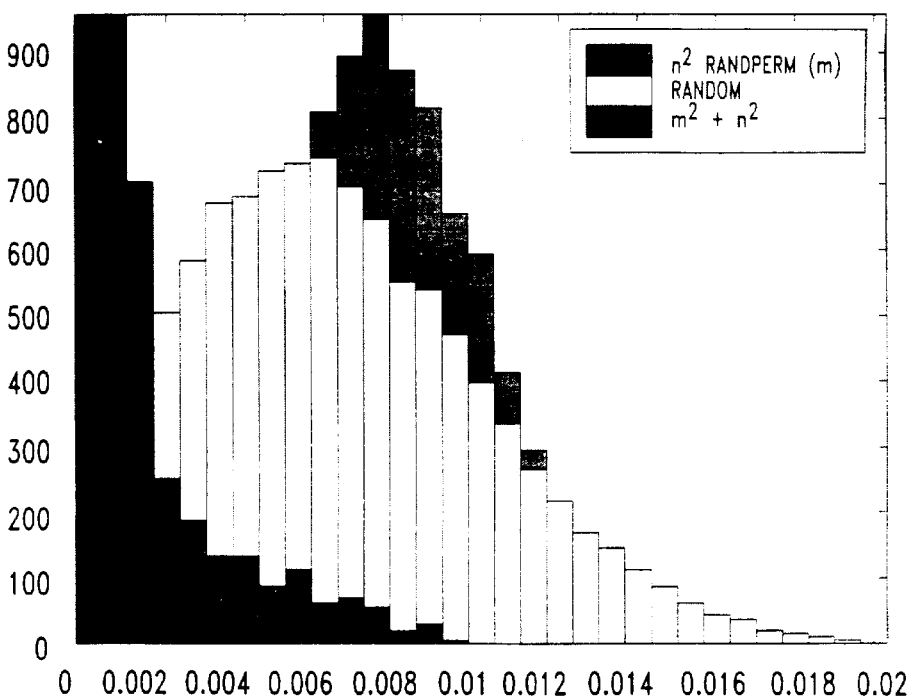
FIG. 7 illustrates a comparison of the intensity histogram of the readout of a plane wave hologram for a random beam, with intensity histograms of two correlated beams.

As a specific example, FIGS. 5–7 show comparisons of histograms generated from the three masks above, i.e., masks reflecting a random phase pattern, an $n^2$randperm(m) phase pattern, and a $m^2+n^2$ phase pattern, for three different (x,y,$\epsilon_x$,$\epsilon_y$) locations. (FIG. 5 shows the histograms for x=y=0, as a function of $\epsilon_x$ and $\epsilon_y$. FIG. 6 shows the histograms for $\epsilon_x$=x=0, as a function of $\epsilon_y$ and y. FIG. 7 shows the histograms for $\epsilon_x$=0, x=400, as a function of $\epsilon_y$ and y.)

FIG. 5 shows a large variation from random for the $m^2+n^2$, but a small variation for $n^2$randperm(m). FIG. 6 again shows a large variation from random for the $m^2+n^2$, and a larger variation than in FIG. 5 for $n^2$randperm(m). FIG. 7 also shows a large variation from random for the $m^2+n^2$, and a moderate variation for $n^2$randperm(m). For each of the two correlated phase patterns, it is clear that comparison to the exponential form of the transfer function for the random mask indicates a beam having correlated phase content.

A reference beam having correlated phase content is useful in a variety of holographic processes, including phase correlation multiplexing and tilt multiplexing, discussed above, optionally in combination with other Bragg storage methods. Other storage techniques are also possible.

For example, FIG. 8 reflects the use of a reference beam having correlated phase content in a holographic apparatus 10. Light, typically a plane wave, coherent beam of laser light 12 is directed into a phase mask 14. The phase mask is designed to provide the light beam 12 with correlated phase content. The correlated beam propagates a distance f1 to a first lens 16, which has a focal length f1. Passing through the first lens 16 produces the Fourier transform of the phase mask 14 at another distance f1 beyond the first lens 16. A high-pass spatial filter 18 is generally provided at the plane of the Fourier transform, the filter 18 typically blocking much of the lower spatial frequencies.

After passing through the filter 18, the beam propagates a second distance f2 to a second lens 20, which has a focal length f2. The beam passes through the second lens 20 and propagates another distance f2 to reach its image plane 22. The beam passing through this image plane 22 constitutes the correlated reference beam 24 for the holographic apparatus 10.

An object beam 30 is encoded with the data to be stored, and is propagated in a manner similar to the correlated reference beam 24, as apparent to one skilled in the art. The object beam 30 and the reference beam having correlated phase content 24 are intersected in holographic storage material 32, and the resulting interference pattern is captured as a hologram.

It is possible for the holographic storage material to be any material capable of recording surface or volume holograms or creating diffracted optics. Examples include photoactive monomers, photoresist materials, thermoplastic materials, photorefractive materials, or photochromatic materials. Specific materials include lithium niobate, and photopolymers such as disclosed in co-assigned U.S. Pat. No. 5,874,187. Suitable materials for particular uses will be apparent to those skilled in the art.

It is possible to produce a reference beam having correlated phase content by use of a variety of optics techniques. In particular, designs that move away from conventional ground glass-type masks, i.e., designs that provide beams having characteristics differing from typical laser speckle characteristics, tend to be useful. (Speckle refers to a granular pattern resulting from diffuse scattering that occurs upon illumination of an object by a coherent light source, as known in the art. See, e.g., P. Hariharan, *Optical Holography-Principles, techniques, and applications*, $2^{nd}$ Ed., Cambridge University Press, 329 (1996).)

Particular examples of optics techniques for providing correlated reference beams include use of linearly chirped phase masks (i.e., masks having varying pixel size in the x-y plane), masks chirped by variation in phase value of the pixels, asymmetrical phase masks, cylindrical lenses (with either random or ordered phase masks), or point source arrays, e.g., laser arrays, alone or in combination with lenslet arrays. Passing a beam, typically a plane wave, coherent beam of light, through such optics generally provides correlated phase content. Any suitable reference beam is capable of being used. Examples include $Ar^+$, He—Cd, YAG, He—Ne, and $Kr^+$ lasers. It is also possible to filter a beam optically in the Fourier plane to provide correlated phase content.

Figure 9A:
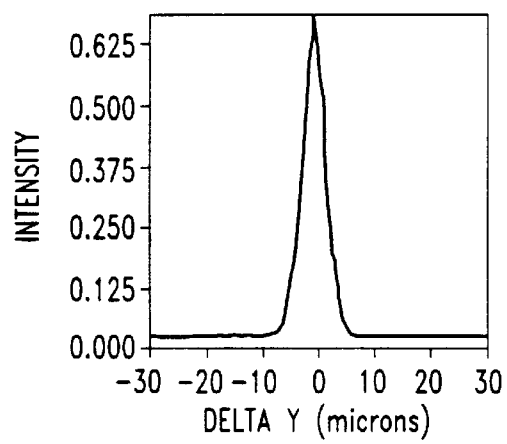
FIGS. 9A and 9B illustrate the improved storage properties provided by a reference beam having correlated phase content provided according to one embodiment of the invention.
Figure 9B:
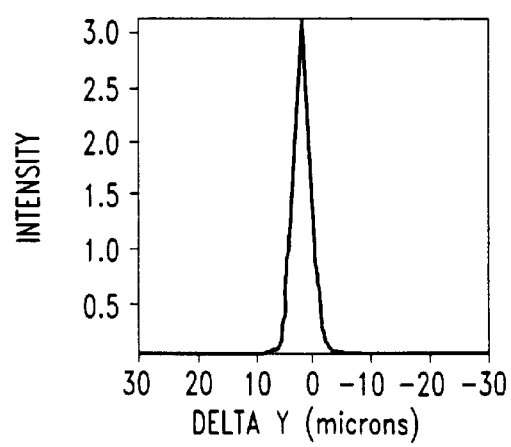

FIGS. 9A and 9B show a comparison of the intensities of holograms stored using reference beams directed through two different phase masks. Specifically, FIG. 9A shows the characteristics of a reference beam passed through a mask having uniformly square pixels of 10 μm. FIG. 9B shows the characteristics of a reference beam passed through a linearly chirped mask having columns of pixels 15 μm square at each edge, the size of the pixels decreasing linearly to a column of 5 μm square pixels at the middle column of the mask (where x is the direction of chirp and y is the direction of uniform columns). The intensity distribution of FIG. 9A has a relatively narrow peak, but exhibits some noise to either side of the peak. By contrast, the distribution of the hologram stored using the chirped mask shows an even narrower peak, with substantially no measurable noise. This result is due to the chirped mask's introduction of complex phase content onto the wavefront of the optical beam, by generating spatially dependent optical delay and amplitude modification. The narrower peak and absence of noise allows increased storage density and improved readout.

Figure 10A:
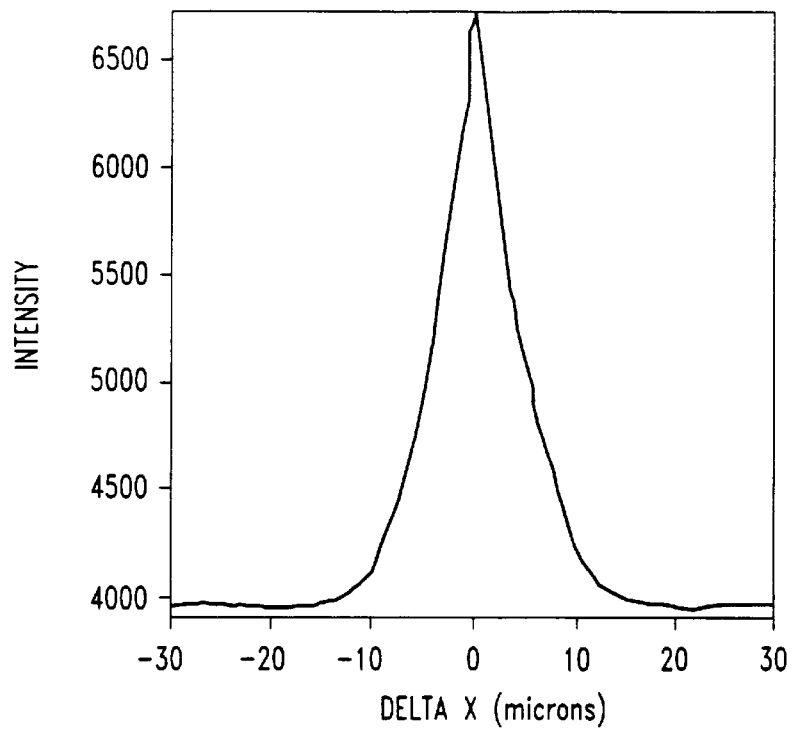
FIGS. 10A and 10B illustrate the improved storage properties provided by a reference beam having correlated phase content provided according to another embodiment of the invention.
Figure 10B:
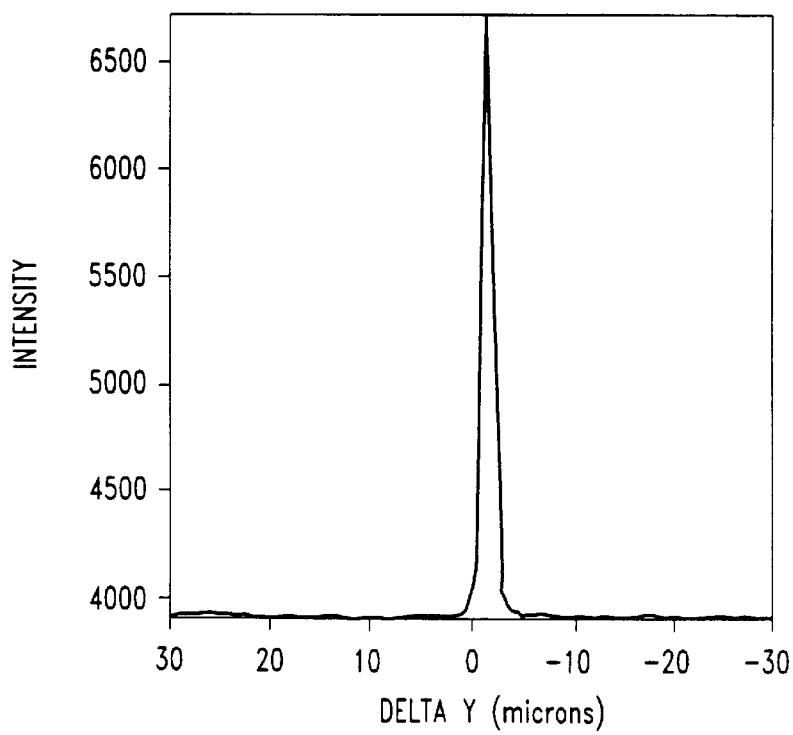

FIGS. 10A and 10B show the intensity of holograms stored using a reference beam directed through an asymmetric mask having dimensions of 24 μm×4 μm (reflecting x-dimension vs. y-dimension, respectively). As shown by FIG. 10A, the peak along the x-dimension has a relatively wide peak, but storage along the y-dimension offers a desirably narrow peak. Such a narrow peak, caused by the difference in correlation length in the x vs. y directions, is desirable in that hologram overlap is substantially reduced such that storage density and readout in the y-dimension is improved.

Similarly, hologram storage using a reference beam directed through a cylindrical lens and then through an asymmetric or linearly chirped phase mask has been shown to be useful. Specifically, for polymeric media, such an arrangement shows an improvement in signal-to-noise ratio of 1.3 times the ratio obtained without the cylindrical lens. This result is due to increasing correlated content of the reference beam, as well as limiting the degree of correlation along more sensitive axes.

Other optical techniques for providing a reference beam with correlated phase content are also possible.

The correlated phase content of the reference beam thus provides accurate shift selectivity (see, e.g., co-assigned U.S. Pat. No. 5,703,705), the ability to tailor the reference beam spectrum to minimize crosstalk between neighboring holograms, and mitigate limitations inherent in the holographic system or holographic medium, e.g., shrinkage. For example, increasing the correlation length in the direction of shrinkage makes the stored holograms more tolerant of material dimensional changes.

Other embodiments of the invention will be apparent to those skilled in the art from consideration of the specification and practice of the invention disclosed herein.

What is claimed is:

1. A process for holography, comprising the steps of:

(a) directing a reference beam at a holographic medium;

(b) providing relative movement between the reference beam and the medium; and (c) repeating steps (a) and (b) at least once, wherein the reference beam contains the same correlated phase content for all repetitions of steps (a) and (b).

2. The process of claim 1, wherein the correlated phase content is provided by passing the beam through a linearly chirped phase mask.

3. The process of claim 1, wherein the correlated phase content is provided by passing the beam through a mask having pixels of varying phase values.

4. The process of claim 1, wherein the correlated phase content is provided by passing the beam through an asymmetric phase mask.

5. The process of claim 1, wherein the correlated phase content is provided by passing the beam through a cylindrical lens and a phase mask selected from an asymmetric mask and a linearly chirped mask.

6. The process of claim 1, wherein the correlated phase content is provided by at least one of a point source array and a lenslet array.

7. The process of claim 1, wherein the correlated phase content is provided by filtering the beam optically in the Fourier plane.

8. The process of claim 1, further comprising the step of directing an object beam at the medium such that the object beam and the reference beam intersect on or within the medium.

9. The process of claim 1, wherein the holography comprises phase correlation multiplexing.

* * * * *